United States Patent
Tak et al.

(10) Patent No.: US 9,202,878 B2
(45) Date of Patent: Dec. 1, 2015

(54) GALLIUM NITRIDE BASED SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventors: Young-jo Tak, Hwaseong-si (KR); Jae-kyun Kim, Hwaseong-si (KR); Jun-youn Kim, Hwaseong-si (KR); Jae-won Lee, Seoul (KR); Hyo-ji Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 13/713,415

(22) Filed: Dec. 13, 2012

(65) Prior Publication Data

US 2013/0328054 A1 Dec. 12, 2013

(30) Foreign Application Priority Data

Jun. 12, 2012 (KR) .................. 10-2012-0062862

(51) Int. Cl.
*H01L 29/15* (2006.01)
*H01L 31/0256* (2006.01)
*H01L 29/267* (2006.01)
*H01L 29/20* (2006.01)
*H01L 21/02* (2006.01)
*H01L 29/16* (2006.01)
*H01L 33/12* (2010.01)
*H01L 33/00* (2010.01)

(52) U.S. Cl.
CPC .......... *H01L 29/267* (2013.01); *H01L 21/0254* (2013.01); *H01L 21/02381* (2013.01); *H01L 21/02447* (2013.01); *H01L 21/02458* (2013.01); *H01L 21/02488* (2013.01); *H01L 29/16* (2013.01); *H01L 29/2003* (2013.01); *H01L 33/12* (2013.01); *H01L 33/007* (2013.01)

(58) Field of Classification Search
None
See application file for complete search history.

(56) References Cited

U.S. PATENT DOCUMENTS

| | | | |
|---|---|---|---|
| 2002/0195606 A1* | 12/2002 | Edmond et al. | 257/79 |
| 2003/0089921 A1* | 5/2003 | Jordan et al. | 257/200 |
| 2003/0193066 A1* | 10/2003 | Ito et al. | 257/335 |
| 2005/0176262 A1* | 8/2005 | Ono et al. | 438/770 |
| 2006/0234455 A1* | 10/2006 | Chen et al. | 438/276 |
| 2007/0087458 A1* | 4/2007 | Tanaka et al. | 438/22 |
| 2010/0015787 A1* | 1/2010 | Yu et al. | 438/483 |
| 2010/0032689 A1* | 2/2010 | Park et al. | 257/87 |

FOREIGN PATENT DOCUMENTS

| | | |
|---|---|---|
| JP | 2008-133188 A | 6/2008 |
| JP | 2010-177355 A | 8/2010 |
| JP | 2012-038973 A | 2/2012 |

OTHER PUBLICATIONS

Huang, X. et al. "High Strength Si Wafers with Heavy B and Ge Codoping"; Japan Applied Physics vol. 42, pp. 1489-1491: Dec. 15, 2003.

Huang, X. et al. "Robust Si wafer"; Journal of Crystal Growth 275, pp. 401-407; Dec. 7, 2004.

* cited by examiner

*Primary Examiner* — Minh-Loan Tran
*Assistant Examiner* — Shaka White
(74) *Attorney, Agent, or Firm* — Harness, Dickey & Pierce, P.L.C.

(57) ABSTRACT

A gallium nitride based semiconductor device includes a silicon-based layer doped simultaneously with boron (B) and germanium (Ge) at a relatively high concentration, a buffer layer on the silicon-based layer, and a nitride stack on the buffer layer. A doping concentration of boron (B) and germanium (Ge) may be higher than $1 \times 10^{19}/cm^3$.

14 Claims, 10 Drawing Sheets

GALLIUM NITRIDE BASED SEMICONDUCTOR DEVICE AND METHOD OF MANUFACTURING THE SAME

CROSS-REFERENCE TO RELATED APPLICATION

This application claims the benefit of Korean Patent Application No. 10-2012-0062862, filed on Jun. 12, 2012, in the Korean Intellectual Property Office, the disclosure of which is incorporated herein in its entirety by reference.

BACKGROUND

1. Field

Example embodiments relate to gallium nitride based ($Al_xIn_yGa_{1-x-y}N$, $0 \leq x+y < 1$) semiconductor devices and methods of manufacturing the same, and more particularly, to gallium nitride based semiconductor devices that simultaneously reduce damage and deformation of a wafer and enhance uniformity of wavelengths of emitted light by reducing a bow of the wafer, and methods of manufacturing the same.

2. Description of the Related Art

GaN materials may be used together with AlN and InN to generate light having relatively wide bands from ultraviolet rays to red spectrum regions, and have relatively high dielectric breakdown characteristics. Thus, GaN materials are widely used to manufacture relatively high power devices. However, GaN thin films are grown on heterogeneous substrates, e.g., sapphire, SiC and/or Si, due to absence of homogeneous substrates. As a result, many defects may occur on grown GaN thin films due to a mismatch in lattice constants between GaN thin films and heterogeneous substrates. Also, a bow of a wafer itself increases due to a mismatch in thermal expansion coefficients between GaN thin films and heterogeneous substrates. If the mismatch increases, cracks may occur in GaN thin films, or heterogeneous substrates may be broken.

For example, in a case where light emitting diodes (LEDs) including multiple quantum wells (MQWs) of an InGaN/GaN structure are formed on silicon substrates, templates used to grow MQWs need to have a defect density below $10^8/cm^2$ in order to manufacture relatively high brightness LEDs. For a defect density below $10^8/cm^2$, buffer layers and GaN thin films grown on silicon substrates need to have relatively great thicknesses. During growth of LED structures on silicon substrates, a compressive stress is applied in order to compensate for a tensile stress due to the mismatch in thermal expansion coefficients. In this regard, the applied compressive stress needs to be on the gigapascal (GPa) scale because buffer layers and GaN thin films have relatively great thicknesses. However, because silicon substrates become ductile at a relatively high temperature, such a relatively high temperature and relatively high compressive stress may cause a plastic deformation of silicon substrates. As a result, silicon substrates after being cooled may have relatively large bows in convex shapes and be hardened or broken.

Such a large bow of a substrate causes temperature non-uniformity during an MQW growth process, which causes a non-uniform composition of In in the MQW. Thus, wavelengths of light generated in the MQW are not uniform, which may deteriorate a yield of an LED. To solve this problem, a method of increasing a thickness of a substrate is generally used. However, an increase in a substrate thickness may raise the price of a substrate as well as may not completely prevent or reduce a plastic deformation of a silicon substrate at a relatively high temperature.

SUMMARY

Example embodiments provide gallium nitride based semiconductor devices that simultaneously reduce damage and deformation of a wafer and enhance uniformity of wavelengths of light emitted by reducing a bow of the wafer, and methods of manufacturing the same.

Additional aspects will be set forth in part in the description which follows and, in part, will be apparent from the description, or may be learned by practice of example embodiments.

According to example embodiments, a semiconductor device may include a silicon-based layer doped with boron (B) and germanium (Ge), a buffer layer on the silicon-based layer, and a nitride stack on the buffer layer.

A doping concentration of boron (B) and germanium (Ge) may be higher than $1 \times 10^{19}/cm^3$. Boron (B) and germanium (Ge) may be doped in the silicon-based layer such that a resistivity of the silicon-based substrate is equal to or less than about 1 Ωcm.

The buffer layer may have one of a single layer structure formed of one of AlN, SiC, $Al_2O_3$, AlGaN, AlInGaN, AlInBGaN, AlBGaN, GaN, and XY, and a multi-layer structure thereof, wherein X includes at least one of titanium (Ti), chromium (Cr), zirconium (Zr), hafnium (Hf), niobium (Nb), and tantalum (Ta), and Y is one of nitrogen (N) and boron (B, $B_2$).

The nitride stack may include a plurality of nitride semiconductor layers, at least one masking layer between the plurality of nitride semiconductor layers, and at least one intermediate layer between the plurality of nitride semiconductor layers.

The plurality of nitride semiconductor layers may be formed of $Al_xIn_yGa_{1-x-y}N$ (where $0 \leq x,y \leq 1$, $x+y<1$). The at least one masking layer may be formed of one of silicon nitride (SiNx) and titanium nitride (TiN).

The semiconductor device may further include a device layer on the nitride stack, and the device layer may include one of a light-emitting diode (LED) device, a high electron mobility transistor (HEMT), and a laser diode (LD) device.

According to example embodiments, a method of manufacturing a semiconductor device may include preparing a silicon based substrate doped with boron (B) and germanium (Ge), forming a buffer layer on the silicon based layer, and forming a nitride stack on the buffer layer.

The preparing a silicon based substrate doped with boron (B) and germanium (Ge) may include performing an ion implantation on the silicon based substrate.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
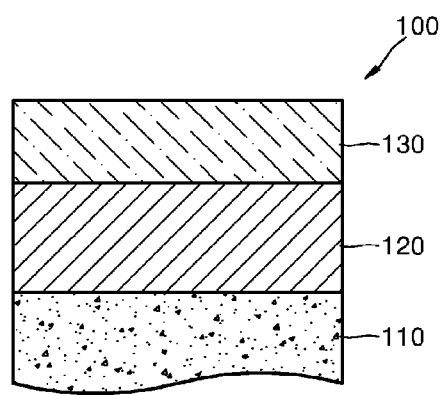
FIG. 1 is a schematic cross-sectional view illustrating a gallium nitride based semiconductor device, according to example embodiments.

Example embodiments will now be described more fully with reference to the accompanying drawings, in which example embodiments are shown. The same reference numerals in the drawings denote the same elements, and sizes or thicknesses of elements may be exaggerated for clarity. Example embodiments are described herein and various modifications may be made in the embodiments. When a layer is referred to as being "on" or "over" another layer or a substrate, it may be directly on the other layer or the substrate, or intervening layers may also be present therebetween. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view illustrating a gallium nitride based semiconductor device 100, according to example embodiments. Referring to FIG. 1, the gallium nitride based semiconductor device 100 may include a silicon based substrate 110, a buffer layer 120, and a nitride stack 130.

The silicon based substrate 110 may be formed by doping a silicon material including silicon (Si) or silicon carbide (SiC) with boron (B) or germanium (Ge) at a relatively high concentration. For example, the doping concentration of boron (B) may be higher than about $10^{19}/cm^3$. In this regard, the doping concentration may be determined to be such that a resistivity of the silicon based substrate 110 is equal to or less than 1 Ωcm.

The silicon based substrate 110 doped simultaneously with boron (B) and germanium (Ge) at a relatively high concentration may be used to reduce warping and slipping of the silicon based substrate 110 from occurring while the semiconductor device 100 is manufactured. In general, the amount of warping is represented with a bow measured at a wafer level.

Figure 2:
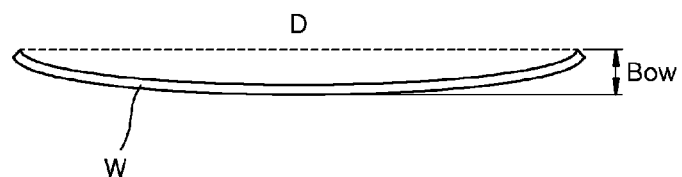
FIG. 2 is a view for defining a bow of a wafer.

FIG. 2 is a view for defining a bow of a wafer. The amount of warping of a substrate occurring during a process may be defined by a bow measured at a wafer level. In this regard, a wafer W collectively denotes a substrate and a thin film formed on the substrate. A bow occurs because thermal expansion coefficients of the substrate and the thin film formed on the substrate are different from each other. When the wafer is cooled to room temperature after a relatively high temperature process necessary for thin film growth, the substrate and the thin film are contracted differently because of their different thermal expansion coefficients, thereby causing the wafer W to warp.

In example embodiments, a difference between a highest position and a lowest position in a thickness direction of the wafer W is referred to as a bow. A bow is proportional to the square of a diameter D of the wafer W when other conditions are not changed. Accordingly, as a diameter of a substrate increases, a bow of the substrate may be increased.

If a general silicon substrate is used and after a nitride semiconductor film is grown, a convex bow of tens to several hundreds of microns is observed, which appears due to a plastic deformation of the silicon substrate. In general, because a thermal expansion coefficient of a silicon substrate is lower than a thermal expansion coefficient of a semiconductor film formed on the silicon substrate, the semiconductor film is more contracted than the silicon substrate during cooling to room temperature, thereby causing a convex bow.

However, in general, a compressive stress on the order of gigapascals is applied in order to offset a tensile stress generated in the semiconductor film during a relatively high temperature process for growth. A relatively high temperature and compressive stress may cause a plastic deformation of the silicon substrate. That is, a silicon substrate, which is brittle at room temperature, may be ductile at a relatively high temperature, and an excessive stress applied to the silicon substrate in this condition causes a plastic deformation of the silicon substrate. In example embodiments, even after the cooling process is performed and the stress is removed, the silicon substrate does not return to its original state and has a convex bow. However, a doped silicon-based substrate may reduce such a bow.

Figure 3:
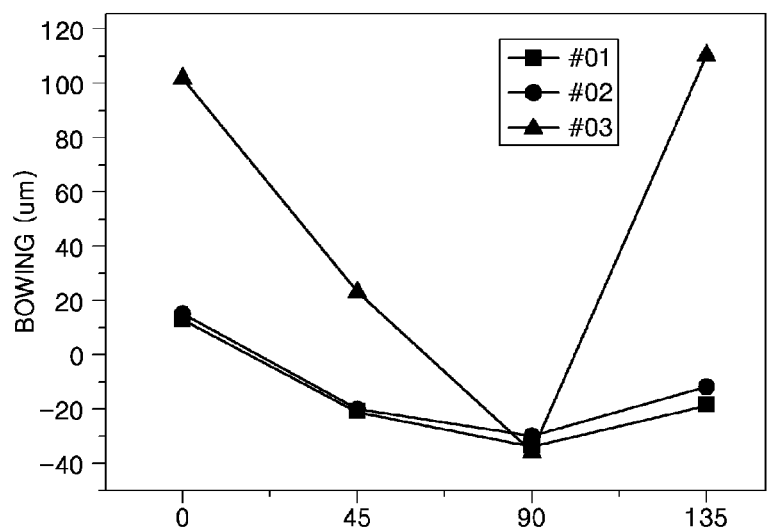
FIG. 3 is a graph of variations of bow of a silicon substrates with respect to a doping concentration of boron (B)

FIG. 3 is a graph of variations of bow of silicon substrates with respect to a doping concentration of boron (B), after a GaN LED is grown on the silicon substrates. Referring to FIG. 3, a "-■-" line indicates a silicon wafer doped with boron (B) at a concentration of about $10^{19}/cm^3$, a "-●-" line indicates a silicon wafer doped with boron (B) at a concentration of about $1.5 \times 10^{19}/cm^3$, and a "-▲-" line indicates a silicon wafer that is not doped with boron (B). A bow of the silicon wafer that is not doped with boron (B) is about 140 um, whereas bows of the silicon wafers doped with boron (B) at relatively high concentrations at the concentrations of about $10^{19}/cm^3$ and $1.5 \times 10^{19}/cm^3$ are merely about 45 um.

Also, deformation of a silicon wafer may be further reduced by doping the silicon wafer with boron (B) and another doping material simultaneously. For example, referring to Table 1 below, in a case where a silicon wafer is doped with boron (B) at a relatively low concentration of about $2.2 \sim 7.0 \times 10^{15}/cm^3$, a slip length of the silicon wafer is about 60 mm, whereas, in a case where a silicon wafer is doped with boron (B) at a relatively high concentration of about $1.0 \sim 1.5 \times 10^{19}/cm^3$, a slip length of the silicon wafer is reduced to about 40 mm. Also, in a case where a silicon wafer is doped with boron (B) and germanium (Ge) at a relatively high concentration of about $1.0 \sim 1.5 \times 10^{19}/cm^3$, a slip length of the silicon wafer may be further reduced to about 20 mm.

TABLE 1

|  | boron (B) $2.2 \sim 7.0 \times 10^{15}/cm^3$ | boron (B) $1.0 \sim 1.5 \times 10^{19}/cm^3$ | boron (B) $1.0 \sim 1.5 \times 10^{19}/cm^3$ germanium (Ge) $1.0 \sim 1.5 \times 10^{19}/cm^3$ |
|---|---|---|---|
| slip length (Si wafer) | 60 mm | 40 mm | 20 mm |

As shown in FIG. 3 and Table 1, in a case where the silicon based substrate 110 doped simultaneously with boron (B) and germanium (Ge) at a relatively high concentration is used, uniformity of wavelengths of light emitted may be enhanced during growth of a gallium nitride based LED. Accordingly, a yield of the gallium nitride based LED may be enhanced. Also, the silicon based substrate 110 having a relatively large diameter of 8 inches or 12 inches may be used, thereby reducing a production cost of a gallium nitride based semiconductor device.

The buffer layer 120 for ensuring predetermined or given thin film quality of the nitride stack 130, which is to be grown on a heterogeneous substrate, may be disposed to reduce defects caused by a difference in lattice constants between the silicon-based substrate 110 and the nitride stack 130 and to prevent or reduce cracks caused by a difference in thermal expansion coefficients between the silicon-based substrate 110 and the nitride stack 130. The buffer layer 120 may include at least one buffer layer, and may include a nucleation-growth layer. For example, the buffer layer 120 may have a single layer structure formed of AlN, SiC, $Al_2O_3$, AlGaN, AlInGaN, AlInBGaN, AlBGaN, GaN, or XY or a multi-layer structure thereof. In this regard, X may be titanium (Ti), chromium (Cr), zirconium (Zr), hafnium (Hf), niobium (Nb), or tantalum (Ta), and Y may be nitrogen (N) or boron (B, $B_2$).

The nitride stack 130 may include at least one GaN-based compound semiconductor layer. The nitride stack 130 may include, for example, a plurality of nitride semiconductor layers. The nitride stack 130 may include a plurality of nitride semiconductor layers, at least one masking layer disposed between the plurality of nitride semiconductor layers, and at least one intermediate layer disposed between the plurality of nitride semiconductor layers.

Figure 4:
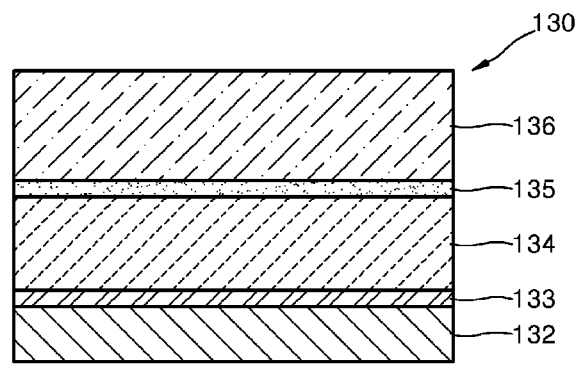
FIG. 4 is a cross-sectional view of a detailed structure of a nitride stack of FIG. 1.

FIG. 4 is a cross-sectional view of a detailed structure of the nitride stack 130. Referring to FIG. 4, the nitride stack 130 may include a first nitride semiconductor layer 132, a second nitride semiconductor layer 134, and a third nitride semiconductor layer 136. The nitride stack 130 may include at least one masking layer 133 disposed between the plurality of nitride semiconductor layers 132, 134 and 136. At least one intermediate layer 135 may be disposed between the plurality of nitride semiconductor layers 134 and 136 disposed above the masking layer 133. The intermediate layer 135 may compensate for a relative tensile stress induced by the second nitride semiconductor layer 134 grown on the masking layer 133.

The nitride semiconductor layers 132, 134 and 136 may be formed of nitride containing gallium. That is, the nitride semiconductor layers 132, 134 and 136 may be formed of $Al_xIn_yGa_{1-x-y}N$ (where $0 \leq x,y \leq 1$, $x+y<1$). For example, the nitride semiconductor layers 132, 134 and 136 may be formed of a material including any one of GaN, InGaN, and AlInGaN.

The masking layer 133 may be formed of silicon nitride (SiNx) or titanium nitride (TiN). For example, a SiNx masking layer may be formed by using $SiH_4$ (silane) and ammonia gas. The masking layer 133 may be formed to randomly cover only parts of the first nitride semiconductor layer 132 without entirely covering the first nitride semiconductor layer 132. Thus, portions of the first nitride semiconductor layer 132 may be exposed. Accordingly, the area of the exposed portions of the first nitride semiconductor layer 132 may be determined by the coverage of the masking layer 133, and initial islands of the second nitride semiconductor layer 134 grown on the masking layer 133 may vary accordingly.

For example, if an area of a SiNx masking layer is increased to reduce an area of the exposed portions of the first nitride semiconductor layer 132, an initial island density of the second nitride semiconductor layer 134 to be grown on the masking layer 133 may be reduced whereas a size of coalesced islands is increased. A defect density of the second nitride semiconductor layer 134 may be reduced due to the masking layer 133, because the masking layer 133 directly masks a threading dislocation or a threading dislocation is bent through island facets of the second nitride semiconductor layer 134.

For example, the nitride stack 130 of FIG. 4 may include the first nitride semiconductor layer 132, the second nitride semiconductor layer 134, and the third nitride semiconductor layer 136 formed of u-GaN, the SiNx masking layer 133 disposed between the first nitride semiconductor layer 132 and the second nitride semiconductor layer 134, and the $Al_xGa_{1-x}N$ intermediate layer 135 disposed between the second nitride semiconductor layer 134 and the third nitride semiconductor layer 136. The nitride semiconductor layers may include a u-GaN layer undoped with impurities.

Alternatively, the first nitride semiconductor layer 132, the second nitride semiconductor layer 134, and the third nitride semiconductor layer 136 may include an n-GaN layer doped with n-type impurities or a p-GaN layer doped with p-type impurities. If the first nitride semiconductor layer 132, the second nitride semiconductor layer 134, and the third nitride semiconductor layer 136 are doped with predetermined or given impurities, the semiconductor device 100 may be used as a template for forming a light-emitting device. If the first nitride semiconductor layer 132, the second nitride semiconductor layer 134, and the third nitride semiconductor layer 136 are undoped, the semiconductor device 100 may be used as a template for forming a power device, or a template for forming a light-emitting device.

Figure 5:
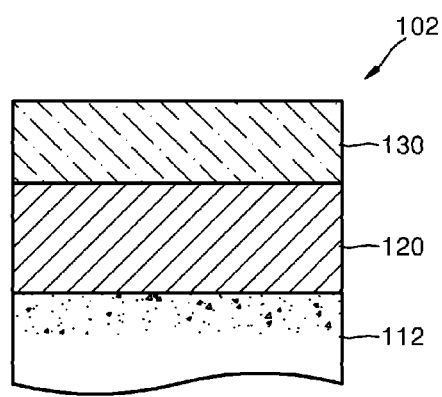
FIG. 5 is a schematic cross-sectional view illustrating a gallium nitride based semiconductor device, according to example embodiments.

FIG. 5 is a schematic cross-sectional view illustrating a gallium nitride based semiconductor device 102, according to example embodiments. Referring to FIG. 5, the semiconductor device 102 may include a silicon-based substrate 112 doped with boron B and germanium (Ge) at a relatively high concentration, the buffer layer 120, and the nitride stack 130. In example embodiments, boron B and germanium (Ge) doped into the silicon-based substrate 112 are mainly distributed near a surface of a top portion of the silicon-based substrate 112. The silicon-based substrate 112 may be formed by preparing a silicon wafer undoped with impurities or doped with impurities at a relatively low concentration and doping the silicon wafer with boron B and germanium (Ge) by ion implantation. Other elements of the semiconductor device 102 are substantially the same as those in FIG. 1.

FIGS. 6A through 6E are cross-sectional views for explaining a method of manufacturing the semiconductor device 100 of FIG. 1 and devices using the semiconductor device 100, according to example embodiments.

Figure 6A:
FIGS. 6A through 6E are cross-sectional views for explaining a method of manufacturing the semiconductor device of FIG. 1 and devices using the semiconductor device, according to example embodiments.

Referring to FIG. 6A, the silicon-based substrate 110 doped with boron (B) and germanium (Ge) at a relatively high concentration is prepared. Silicon and/or silicon carbide may be used as a material of the silicon-based substrate 110. The silicon-based substrate 110 may be formed by doping boron (B) and germanium (Ge) during silicon ingot growth. A doping concentration of boron (B) and germanium (Ge) may be higher than about $1 \times 10^{19}/cm^3$. Alternatively, a doping concentration may be determined to be such that a resistivity of the silicon-based substrate 110 is equal to or less than about 1 Ωcm.

Figure 6B:
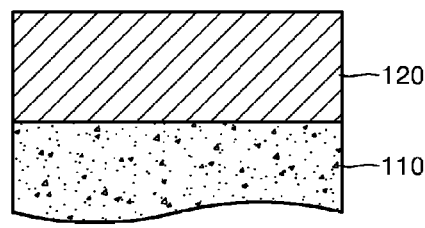

Referring to FIG. 6B, the buffer layer 120 may be formed on the silicon-based substrate 110. The buffer layer 120 may have a single layer structure formed of AlN, SiC, $Al_2O_3$, AlGaN, AlInGaN, AlInBGaN, AlBGaN, GaN, or XY, or a multi-layer structure thereof. In this regard, X may be Ti, Cr, Zr, Hf, Nb, or Ta, and Y may be nitrogen (N) or boron (B, $B_2$).

Figure 6C:
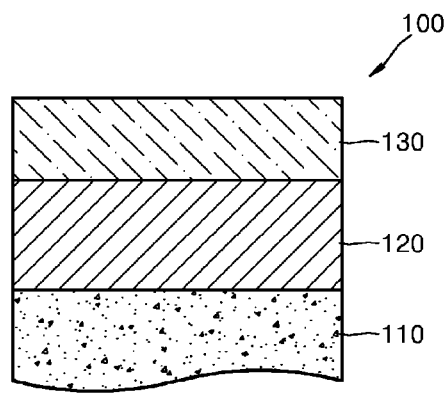
Figure 6D:
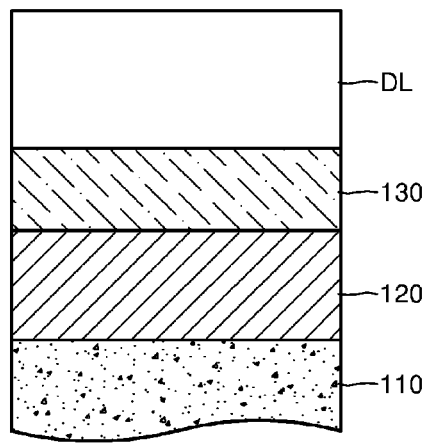

Referring to FIG. 6C, the nitride stack 130 may be formed on the buffer layer 120. The nitride stack 130 may include a GaN-based compound semiconductor layer. The nitride stack 130 may be doped with predetermined or given impurities, if necessary. For example, the nitride stack 130 may be doped with n-type impurities so that the semiconductor device 100 may be used as a template for manufacturing a light-emitting device, or the nitride stack 130 may be undoped with impurities so that the semiconductor device 100 may be used as a template for manufacturing a power device.

The buffer layer 120 and the nitride stack 130 may be formed according to a general semiconductor manufacturing process, for example, a metal organic chemical vapor deposition (MOCVD) process. A total thickness of the buffer layer 120 and the nitride stack 130 may be determined to be such that a defect density is equal to or less than an appropriate level, and may be about 3 μm or more than 3 μm. Also, in consideration of a difference in thermal expansion coefficients between the silicon-based substrate 110, the buffer layer 120, and the nitride stack 130, a stress for offsetting a stress generated during cooling to room temperature after a relatively high temperature process may be applied when the buffer layer 120 and the nitride stack 130 are grown. For example, if thermal expansion coefficients of the buffer layer 120 and the nitride stack 130 are higher than a thermal expansion coefficient of the silicon-based substrate 110, in order to offset a tensile stress generated during cooling, a compressive stress may be applied during a relatively high temperature process.

The semiconductor device 100 illustrated in FIG. 6C may be used as a template for forming various semiconductor devices. For example, referring to FIG. 6D, a device layer DL may be formed on the nitride stack 130. The device layer DL may include a plurality of thin film layers formed of a material suitable for a device to be manufactured. Examples of the device to be manufactured may be a light-emitting diode (LED) device, a power device, e.g., a high electron mobility transistor (HEMT), and a laser diode (LD) device.

Figure 6E:
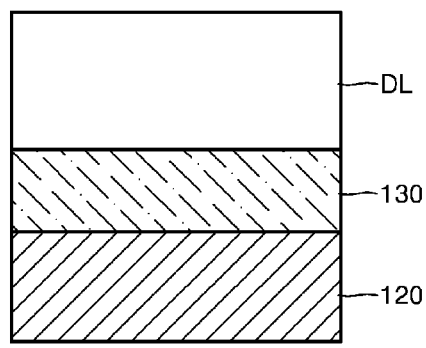

Referring to FIG. 6E, the silicon-based substrate 110 may be separated from the semiconductor device 100. The silicon-based substrate 110 may be separated by using a grinding process and a wet etching process, or by using a dry etching process, but example embodiments are not limited thereto.

FIGS. 7A through 7F are cross-sectional views for explaining a method of manufacturing the semiconductor device 102 of FIG. 5 and devices using the semiconductor device 102, according to example embodiments.

Figure 7A:
FIGS. 7A through 7F are cross-sectional views for explaining a method of manufacturing the semiconductor device of FIG. 5 and devices using the semiconductor device, according to example embodiments.

Referring to FIG. 7A, a substrate 110' is prepared. The substrate 110' may be a silicon substrate or a silicon carbide (SiC) substrate. The substrate 110' may be doped with boron (B) and germanium (Ge) at a relatively high concentration, by using ion implantation.

Figure 7B:
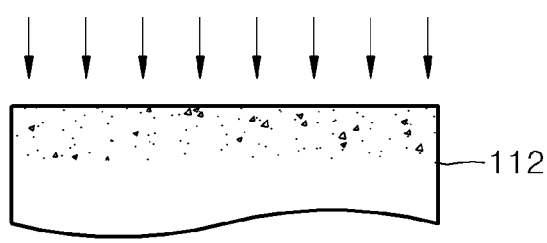
Figure 7C:
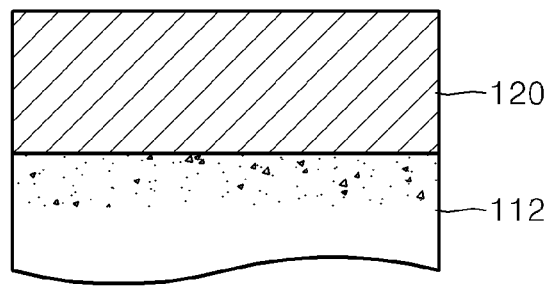
Figure 7D:
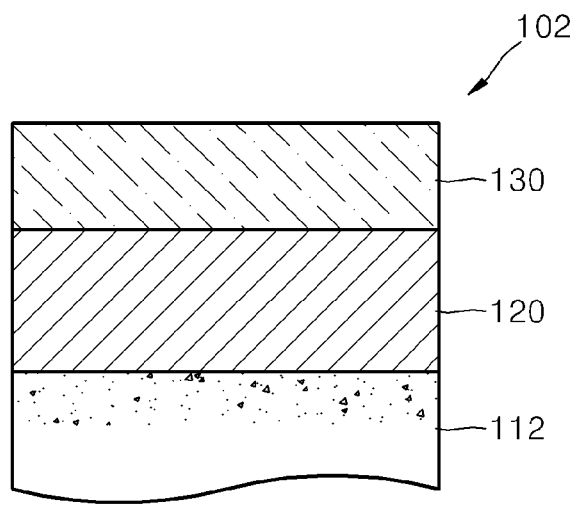
Figure 7E:
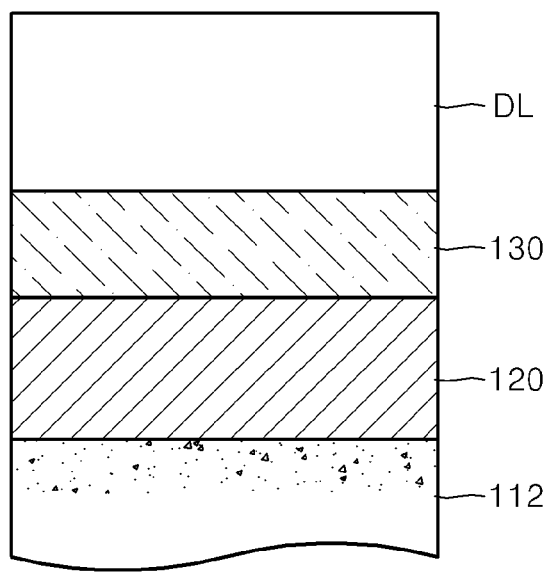
Figure 7F:
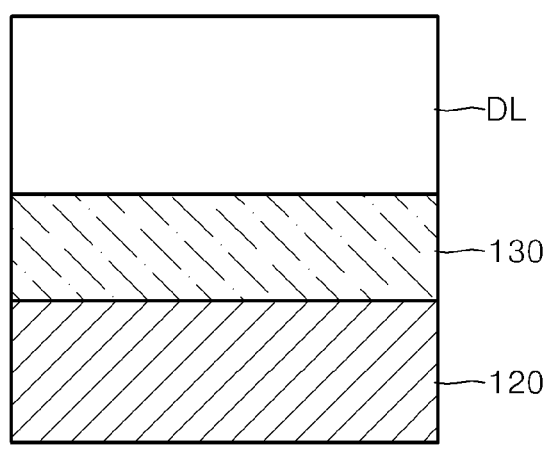

Accordingly, referring to FIG. 7B, boron (B) and germanium (Ge) are mainly distributed near a surface of a top portion to form the silicon-based substrate 112. Processes of FIGS. 7C through 7F are substantially the same as those of FIGS. 6B through 6E. That is, the buffer layer 120, the nitride stack 130, and the device layer DL may be formed. The silicon-based substrate 112 may be optionally separated from the semiconductor device 120.

Because the silicon-based substrates 110 and 112, which are doped with boron (B) and germanium (Ge) at a relatively high concentration during the above manufacturing process, are used, a plastic deformation of the silicon substrates 110 and 112 rarely occurs, thereby reducing a bow and achieving improved thin film quality. Also, the semiconductor devices 100 and 102 may be used as templates for manufacturing various light-emitting devices or power devices having improved quality.

Figure 8A:
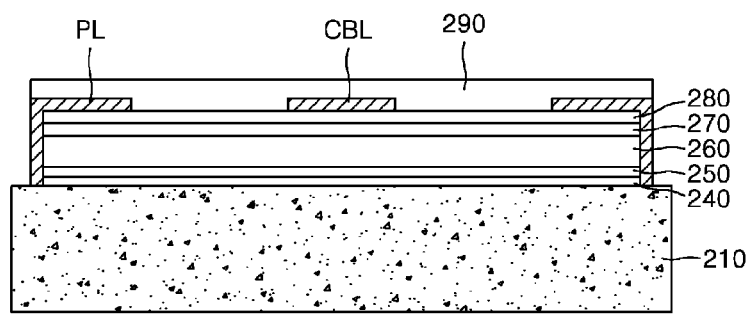
FIGS. 8A through 8D are cross-sectional views for explaining a method of manufacturing a light emitting device, according to example embodiments.

For example, a method of manufacturing a light-emitting device 300 on such a template will be explained with reference to FIGS. 8A through 8D. Referring to FIG. 8A, after a wafer in which a light-emitting device layer is grown on a template is subjected to isolation etching, a dielectric material for acting as a chip passivation and current blocking layer (CBL) is deposited and patterned.

In detail, a buffer layer 240, a nitride stack 250, an n-type semiconductor layer 260, an active layer 270, and a p-type semiconductor layer 280 may be formed on a silicon-based substrate 210 doped with boron (B) and germanium (Ge) at a relatively high concentration, and a PL layer PL and a CBL layer CBL formed of a dielectric material may be formed in a predetermined or given pattern. The buffer layer 240 and the nitride stack 250 may have the same structure as that of the buffer layer 240 and the nitride stack 130 as explained in FIG. 1 or FIG. 5. A metal layer 290 having a p-ohmic contact function and a reflection function may be deposited on the p-type semiconductor layer 280 and the CBL layer CBL.

Figure 8B:
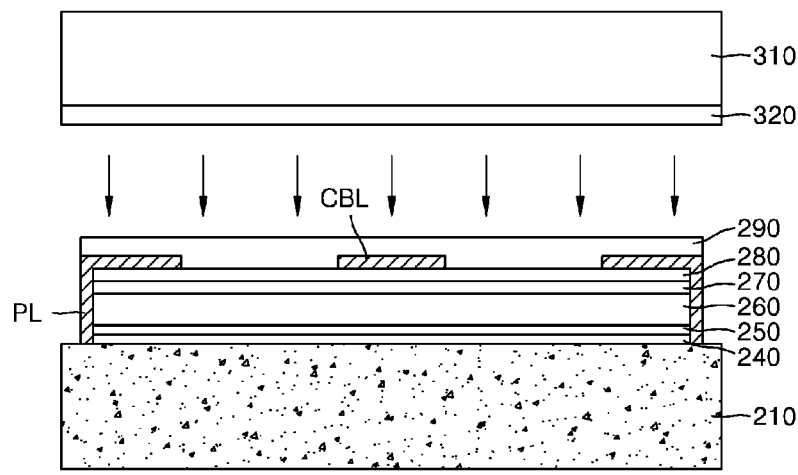

Referring to FIG. 8B, a sub-mount 310 is adhered to such the structure shown in FIG. 8A. The sub-mount 310 may be formed of silicon. A bonding metal layer 320 for bonding may be formed on one surface of the sub-mount 310. The bonding metal layer 320 and the metal layer 290 may be eutectically bonded to each other at a temperature of about 300° C. or higher.

Figure 8C:
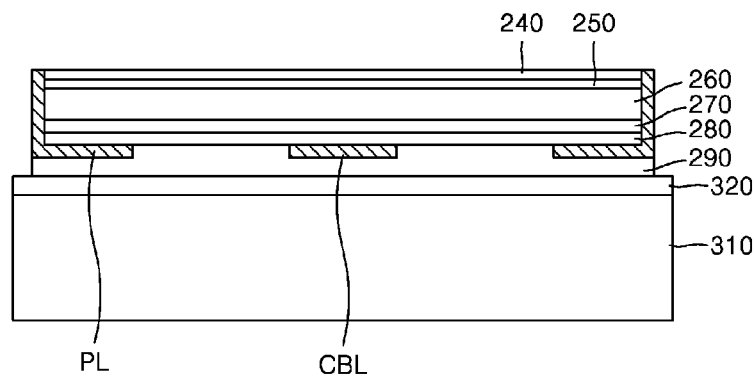

Referring to FIG. 8C, the silicon-based substrate 210 may be removed by a grinding process and a wet etching process, or by using a dry etching process. In FIG. 8C, the sub-mount 310 is located below, unlike in FIG. 8B.

Figure 8D:
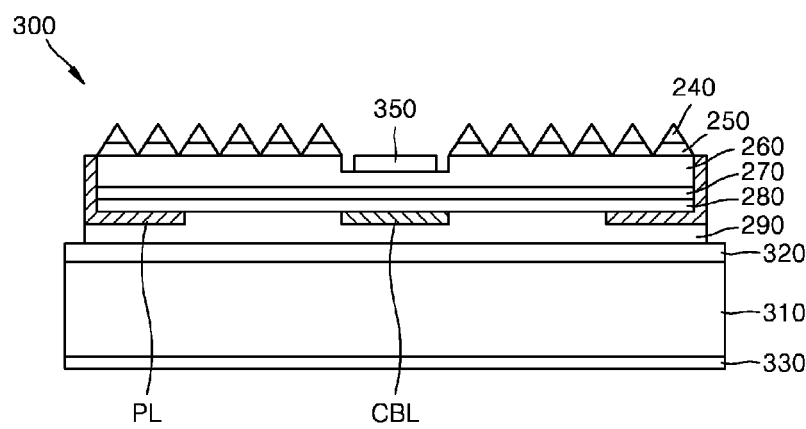

Referring to FIG. 8D, a texturing process may be performed on a surface from which the silicon-based substrate 210 is removed in order to improve light emission efficiency of the active layer 270. The buffer layer 240 and the nitride stack 250, which have been textured, are partially etched, to expose a portion of the n-type semiconductor layer 260. A metal layer 350 for n-ohmic contact may be formed on the exposed portion of the n-type semiconductor layer 260. Also, the vertical light-emitting device 300 may be formed by forming an electrode layer 330 for applying a voltage on a bottom surface of the sub-mount 310.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A semiconductor device comprising:
   a silicon-based layer doped with boron (B) and germanium (Ge);
   a buffer layer on the silicon-based layer;
   a nitride stack on the buffer layer, the nitride stack including,
      a plurality of nitride semiconductor layers,
      at least one masking layer between the plurality of nitride semiconductor layers, the at least one masking layer including titanium nitride (TiN), and
      at least one intermediate layer between the plurality of nitride semiconductor layers, the at least one intermediate layer including $Al_xGa_{1-x}N$; and
   a device layer on the nitride stack, the device layer including one of a light-emitting diode (LED) device, a high electron mobility transistor (HEMT), and a laser diode (LD) device.

2. The semiconductor device of claim 1, wherein a doping concentration of the boron (B) and the germanium (Ge) is higher than $1 \times 10^{19}/cm^3$.

3. The semiconductor device of claim 1, wherein the boron (B) and the germanium (Ge) are doped in the silicon-based layer such that a resistivity of the silicon-based layer is equal to or less than about 1 Ωcm.

4. The semiconductor device of claim 1, wherein the buffer layer has one of a single layer structure formed of one of AlN, SiC, $Al_2O_3$, AlGaN, AlInGaN, AlInBGaN, AlBGaN, GaN, and XY, and a multi-layer structure thereof, wherein X includes at least one of titanium (Ti), chromium (Cr), zirconium (Zr), hafnium (Hf), niobium (Nb), and tantalum (Ta), and Y is one of nitrogen (N) and boron (B, $B_2$).

5. The semiconductor device of claim 1, wherein the plurality of nitride semiconductor layers are formed of $Al_xIn_yGa_{1-x-y}N$ (where $0 \leq x, y \leq 1$, $x+y<1$).

6. A method of manufacturing a semiconductor device, the method comprising:
   preparing a silicon based substrate doped with boron (B) and germanium (Ge);
   forming a buffer layer on the silicon based layer;
   forming a nitride stack on the buffer layer, wherein the forming a nitride stack includes,
      forming a plurality of nitride semiconductor layers on the buffer layer,
      forming at least one masking layer between the plurality of nitride semiconductor layers, the at least one masking layer including titanium nitride (TiN), and
      forming at least one intermediate layer between the plurality of nitride semiconductor layers, the at least one intermediate layer including $Al_xGa_{1-x}N$; and
   forming a device layer on the nitride stack, the device layer including one of a light-emitting diode (LED) device, a high electron mobility transistor (HEMT), and a laser diode (LD) device.

7. The method of claim 6, wherein the preparing performs an ion implantation on the silicon based substrate.

8. The method of claim 6, wherein the preparing includes doping the silicon based substrate with the boron (B) and the germanium (Ge) at a doping concentration higher than $1 \times 10^{19}/cm^3$.

9. The method of claim 6, wherein the preparing includes doping the silicon based substrate with the boron (B) and the germanium (Ge) such that a resistivity of the silicon-based substrate is equal to or less than about 1 Ωcm.

10. The method of claim 6, wherein the forming a buffer layer includes forming one of a single layer structure of one of AlN, SiC, $Al_2O_3$, AlGaN, AlInGaN, AlInBGaN, AlBGaN, GaN, and XY, and a multi-layer structure thereof, wherein X includes at least one of titanium (Ti), chromium (Cr), zirconium (Zr), hafnium (Hf), niobium (Nb), and tantalum (Ta), and Y is one of nitrogen (N) and boron (B, $B_2$).

11. The method of claim 6, wherein the forming a plurality of nitride semiconductor layers includes forming layers of $Al_xIn_yGa_{1-x-y}N$ (where $0 \leq x, y \leq 1$, $x+y<1$).

12. The semiconductor device of claim 1, wherein the silicon-based layer is formed of one of silicon (Si) and silicon carbide (SiC) and doped with both the boron and the germanium.

13. The method of claim 6, wherein the preparing includes doping the silicon based substrate formed of one of silicon (Si) and silicon carbide (SiC).

14. The method of claim 6, wherein the preparing dopes the silicon based substrate with the boron (B) and the germanium (Ge) simultaneously.

* * * * *